(12) United States Patent
Cereda et al.

(10) Patent No.: US 6,365,456 B1
(45) Date of Patent: Apr. 2, 2002

(54) PROCESS FOR MANUFACTURING SEMICONDUCTOR INTEGRATED MEMORY DEVICES WITH CELLS MATRIX HAVING VIRTUAL GROUND

(75) Inventors: Manlio Sergio Cereda, Lomagna; Claudio Brambilla, Concorezzo; Paolo Caprara, Milan, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/507,777

(22) Filed: Feb. 18, 2000

(30) Foreign Application Priority Data

Feb. 26, 1999 (EP) .............................................. 99830101

(51) Int. Cl.⁷ ........................................... H01L 21/336
(52) U.S. Cl. ....................... 438/257; 438/266; 257/316; 365/185.01; 365/185.16
(58) Field of Search ................. 438/257, 266; 257/316; 365/185.01, 185.16

(56) References Cited

U.S. PATENT DOCUMENTS

| | | | |
|---|---|---|---|
| 5,240,870 A | * | 8/1993 | Bergemont |
| 5,327,378 A | | 7/1994 | Kazerounian ............... 365/185 |
| 5,916,821 A | * | 6/1999 | Kerber |
| 5,946,576 A | * | 8/1999 | Wen |
| 6,001,689 A | * | 12/1999 | Van Buskirk et al. |
| 6,080,624 A | * | 6/2000 | Kamiya et al. |

FOREIGN PATENT DOCUMENTS

| | | |
|---|---|---|
| DE | 195 26 011 C1 | 11/1996 |
| EP | 0 731 501 A1 | 9/1996 |
| JP | 05190809 | 7/1993 |

OTHER PUBLICATIONS

Johnson et al., "Method for Making Submicron Dimensions in Structures Using Sidewall Image Transfer Techniques," *IBM Technical Disclosure Bulletin* 26(9):4587–4589, Feb. 1984.

* cited by examiner

Primary Examiner—Charles Bowers
Assistant Examiner—Stephen W. Smoot
(74) Attorney, Agent, or Firm—Lisa Jorgenson; Robert Iannucci; Seed IP Law Group, PLLC

(57) ABSTRACT

A process for manufacturing electronic semiconductor integrated memory devices having a virtual ground and comprising at least a matrix of floating gate memory cells is presented. In the memory device, the matrix is formed on a semiconductor substrate with a number of continuous bit lines extending across the substrate as discrete parallel strips. The process begins by growing an oxide layer over the matrix region and depositing over the semiconductor throughout a stack structure which comprises a first conductor layer, a first dielectric layer, and a second conductor layer. Then a second dielectric layer is deposited over the stack structure, and floating gate regions are defined by photolithography using a mask of "POLY1 along a first direction", to thereby define in the dielectric layer, a plurality of parallel strips which delimit a first dimension of floating gate regions. Next the dielectric layer is etched away to define a plurality of parallel dielectric strips and a number of dielectric islands are defined by photolithography using a mask of "POLY1 along a second direction" in the plurality of parallel strips. The dielectric layer is etched to define the plurality of islands. Finally, the stack structure and the thin gate oxide layer are etched to define gate regions of the matrix cells using said oxide island.

16 Claims, 5 Drawing Sheets

PROCESS FOR MANUFACTURING SEMICONDUCTOR INTEGRATED MEMORY DEVICES WITH CELLS MATRIX HAVING VIRTUAL GROUND

TECHNICAL FIELD

This invention relates to an improved process of manufacturing semiconductor integrated electronic memory devices with cells matrix having virtual ground, and more specifically, to a matrix of floating gate memory cells formed on a semiconductor substrate with a plurality of continuous bit lines extending across the substrate as discrete parallel strips.

BACKGROUND OF THE INVENTION

The invention relates, particularly but not exclusively, to a process for manufacturing semiconductor integrated electronic memory devices with cells matrix having virtual ground, and throughout the following description, reference will be made to that technical field for convenience of illustration.

Electronic semiconductor-integrated EPROM or Flash EPROM memory devices include a number of non-volatile memory cells organized in matrix form; that is, the cells are arranged into rows, or word lines, and columns, or bit lines.

Each non-volatile memory cell has a MOS transistor with a floating gate electrode located above the channel region. This floating gate has a high D.C. impedance to all the other terminals of the same cell and to the circuit in which the cell is incorporated. The cell also has a second electrode, the control gate, which is driven by appropriate control voltages. The other transistor electrodes are, as usual, the drain and source terminals.

In recent years, considerable effort went to the development of memory devices with increased circuit density. This effort resulted in electrically programmable non-volatile memory matrices of the contactless type being developed which have a so-called "tablecloth" or cross-point structure.

An example of matrices of this kind, and their manufacturing process, is described in European Patent No. 0 573 728 to this Applicant, hereby incorporated by reference.

In matrices of this type, the matrix bit lines are formed in the substrate as continuous parallel diffusion strips. These matrices include memory cells which have floating gate capacitive coupling MOS devices.

Conventionally, the process flow for manufacturing these matrices includes forming, on the semiconductor substrate, a stacked ply structure which includes a first layer of gate oxide, first layer of polysilicon, second layer of interpoly oxide, and second layer of polysilicon. An implantation step is then carried out to provide the bit lines, and after the deposition of a planarizing layer, the matrix word lines are formed.

In the prior art, the gate regions of the individual cells are then defined by self-aligned etching. This solution has several drawbacks in that the self-aligned etch step becomes more critical in smaller sized cells.

SUMMARY OF THE INVENTION

Embodiments of the invention provide a process for defining memory cells, arranged into matrices of the crosspoint type, which have structural and functional features that avoids the need for a critical gate region defining step, thereby overcoming the limitations and drawbacks which still beset the memory cells of prior art crosspoint matrices.

In embodiments of the invention, each gate region of the matrix cells is fully defined by an oxide island, before the matrix bit lines are defined.

Presented is a process for manufacturing electronic semiconductor integrated memory devices that begins with growing an oxide layer over a cell matrix region of the memory device. Then, a stack structure is formed that includes a first conductor layer, a first dielectric layer, and a second conductor layer. After that, a second dielectric layer is deposited over the semiconductor. Floating gate regions are defined by photolithography using a mask of "POLY1 long a first direction", to define, in the second dielectric layer, a number of parallel strips which delimit a first dimension of floating gate regions. The parallel strips are then etched from the second dielectric layer. Next, a Poly1 mask is used in a second direction to define a number of dielectric islands in the parallel strips, and the islands are etched. The stack structure and the thin gate oxide layer are then etched to define gate regions of the matrix cells using the oxide island.

The features and advantages of a device according to the invention will become apparent from the following description of an embodiment thereof, given by way of non-limitative example with reference to the accompanying drawings.

DETAILED DESCRIPTION

An improved process for manufacturing electronic memory devices integrated in a semiconductor substrate and comprising virtual ground cell matrices will be described with reference to the drawings.

The process steps discussed hereinafter do not form a complete process flow for manufacturing integrated circuits. The present invention can be used with the integrated circuit manufacturing techniques currently employed in the art, and of the process steps commonly used, only such as are necessary for an understanding of the invention will be discussed. Discussion of steps well known to those skilled in the art has been abbreviated or eliminated for brevity. Those Figures which show in perspective portions of an integrated circuit during their manufacturing are not drawn to scale, but rather to highlight important features of the invention. Accordingly, the description which follows will be limited to the definition of the memory cell matrix, although the invention is not limited to only the shown and described structure.

Figure 1:
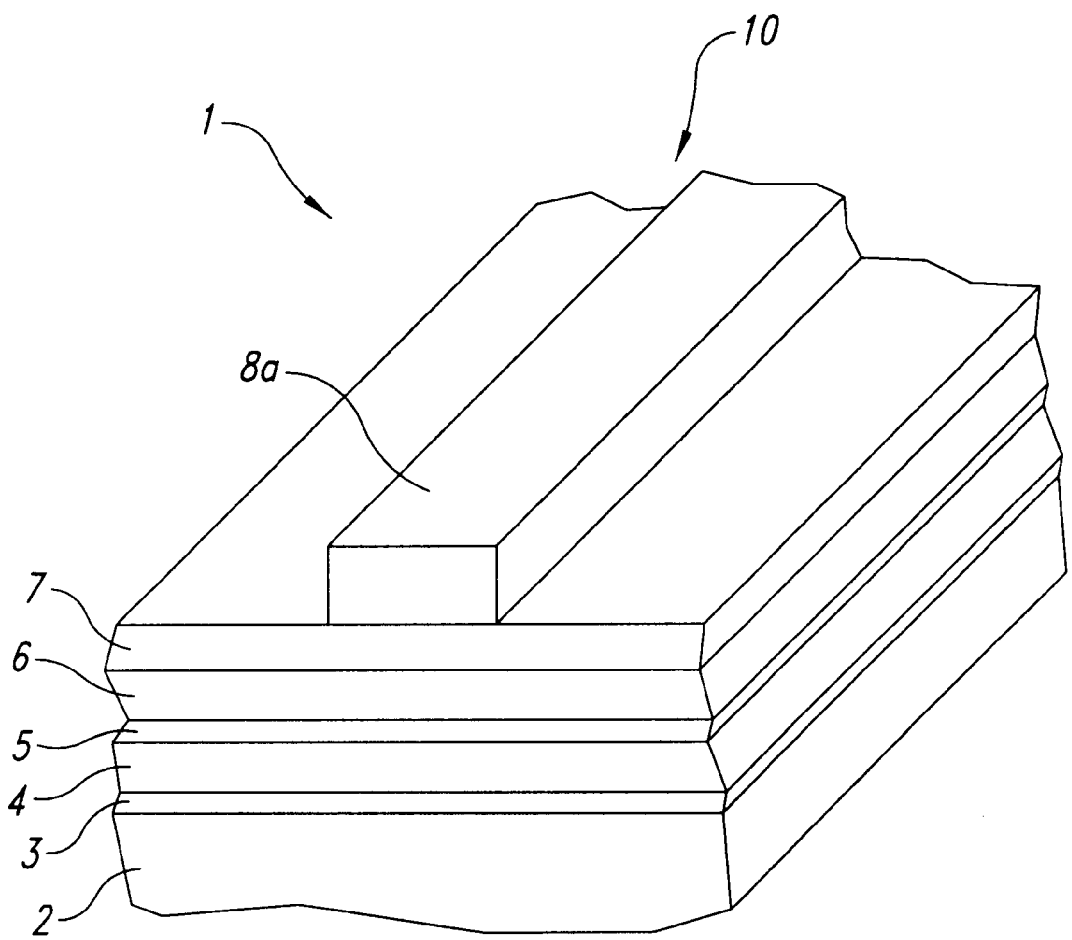
FIGS. 1 to 4 are perspective views showing a portion of a semiconductor for forming virtual ground cell matrices in the evolution of a manufacturing process according to an embodiment of the invention.

With reference to FIG. 1, to form memory cells with floating gate capacitively coupled MOS devices on a semiconductor substrate 2, the process flow should provide for multiple deposition all over the semiconductor area in order to produce a stack structure including a first layer 3 of gate oxide, a first conductor layer 4, (also referred to as POLY1), an intermediate dielectric layer 5, and a second conductor layer 6 (also referred to as a POLY CAP).

Typically, the material used for the first and second conductor layers 4 and 6 would be polysilicon, and they will be hereinafter referred to as a first polysilicon layer 4 and a poly cap layer 6, respectively. The intermediate dielectric layer 5 could be an interpoly ONO (Oxide-Nitride-Oxide), for example.

At this step of the process, the poly cap layer 6 can be doped. A protective dielectric layer 7, e.g., a so-called top oxide, is deposited on top of the poly cap layer 6.

In accordance with embodiments of the invention, gate regions 10 of the matrix 1 are defined at this step of the manufacturing process. A first mask 8a of a photo-sensitive material, such as a photoresist, referred to as a definition mask for the POLY1 along a first predetermined direction, is used to define the protective dielectric layer 7 along the first direction. FIG. 1 is a perspective view of the stack structure provided by this sequence of steps.

The portion of protective dielectric layer 7 that is not covered by the first mask 8a is etched away by a conventional photolithographic step.

Figure 2:
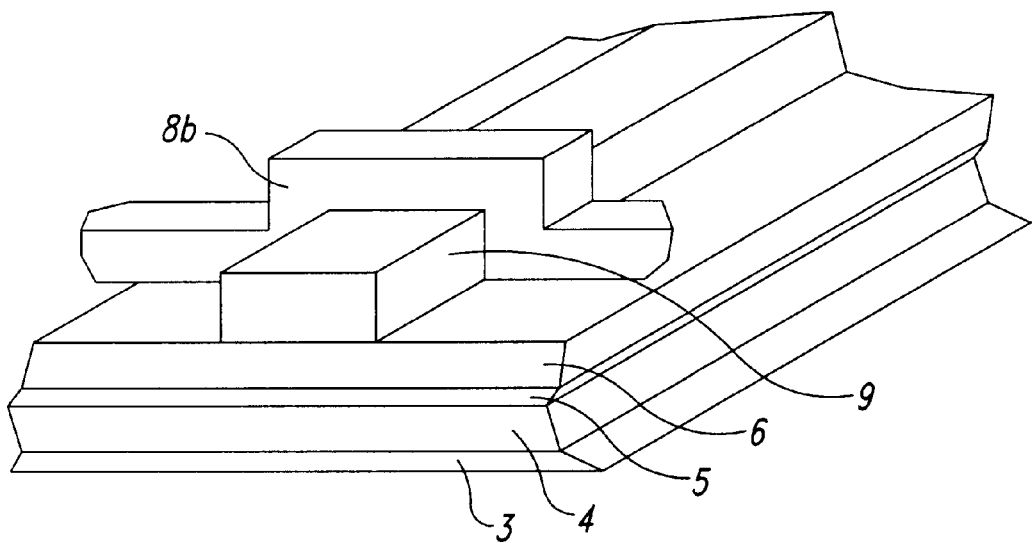

After removal of the first mask 8a, the protective dielectric layer 7 appears as a plurality of parallel protective strips 9 which extend along the first direction and overlie the poly cap layer 6. (FIG. 2)

A second mask 8b of a photo-sensitive material, such as a photoresist, referred to as a definition mask for the poly cap layer 6 along a second predetermined direction, is used to define the parallel protective strips 9 along the second direction. The second direction lies substantially orthogonal to the first direction.

Figure 3:
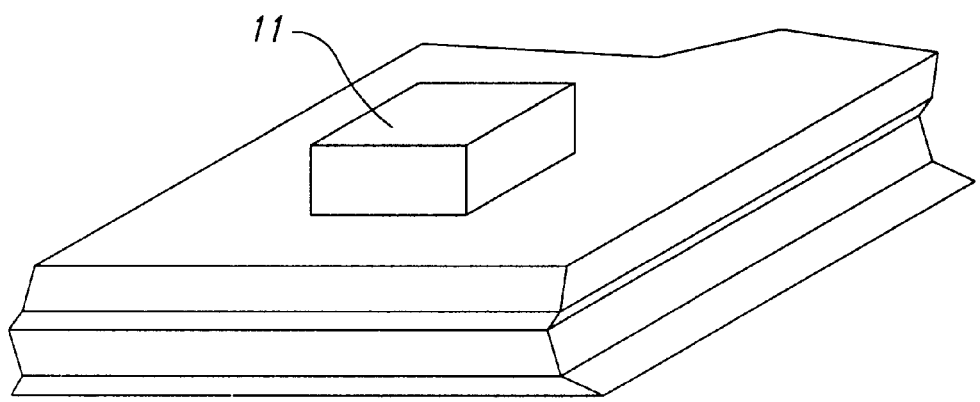

The uncovered portion of the parallel protective strips 9 are etched further away by a conventional photolithographic step. At this point, the protective dielectric layer 7 appears as formed of a plurality of islands 11 overlying the poly cap layer 6. (FIG. 3)

Using a conventional photolithographic step, the stack structure that is not protected by the plurality of islands 11 is then etched away in cascade, thereby removing the poly cap layer 6, the intermediate dielectric layer 5, the first polysilicon layer 4 and the gate oxide layer 3, in that order, to expose the semiconductor substrate 2.

Figure 4:
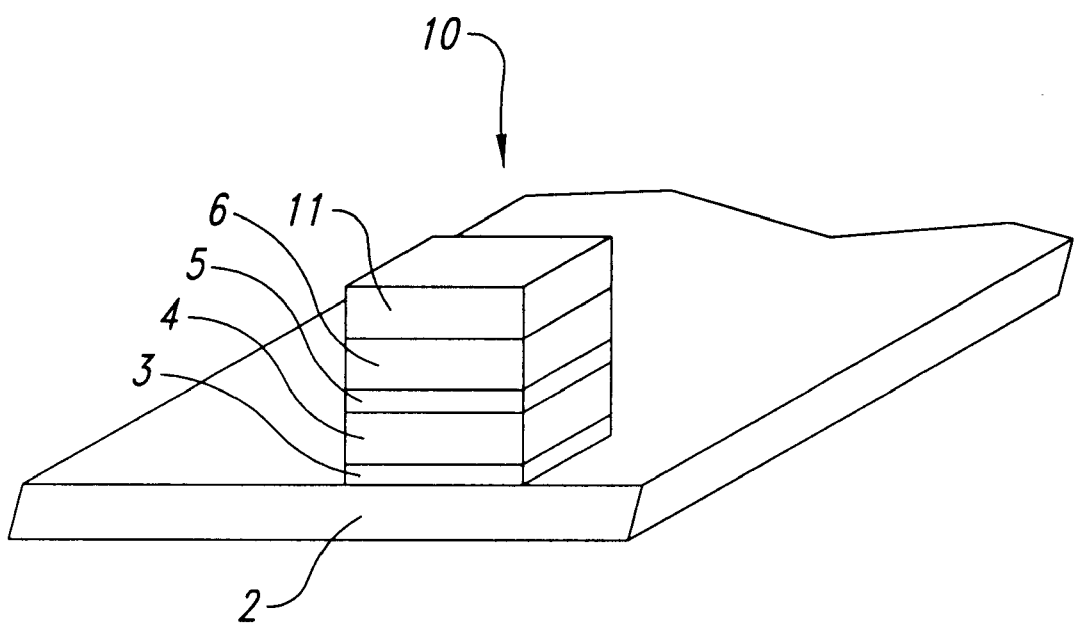

The gate regions 10 of the cells in the matrix 1 are now completed (FIG. 4). If desired, the resultant gate regions 10 may be sealed by an oxidation step. Advantageously, spacers are formed on the side walls of the gate regions 10.

Advantageously, the first mask 8a of resist is also used to define the bit lines of the matrix 1. A first arsenic ion implantation, as necessary to provide N+ electric conductivity, allows bit lines BL of the virtual ground matrix 1 to be defined.

Figure 5:
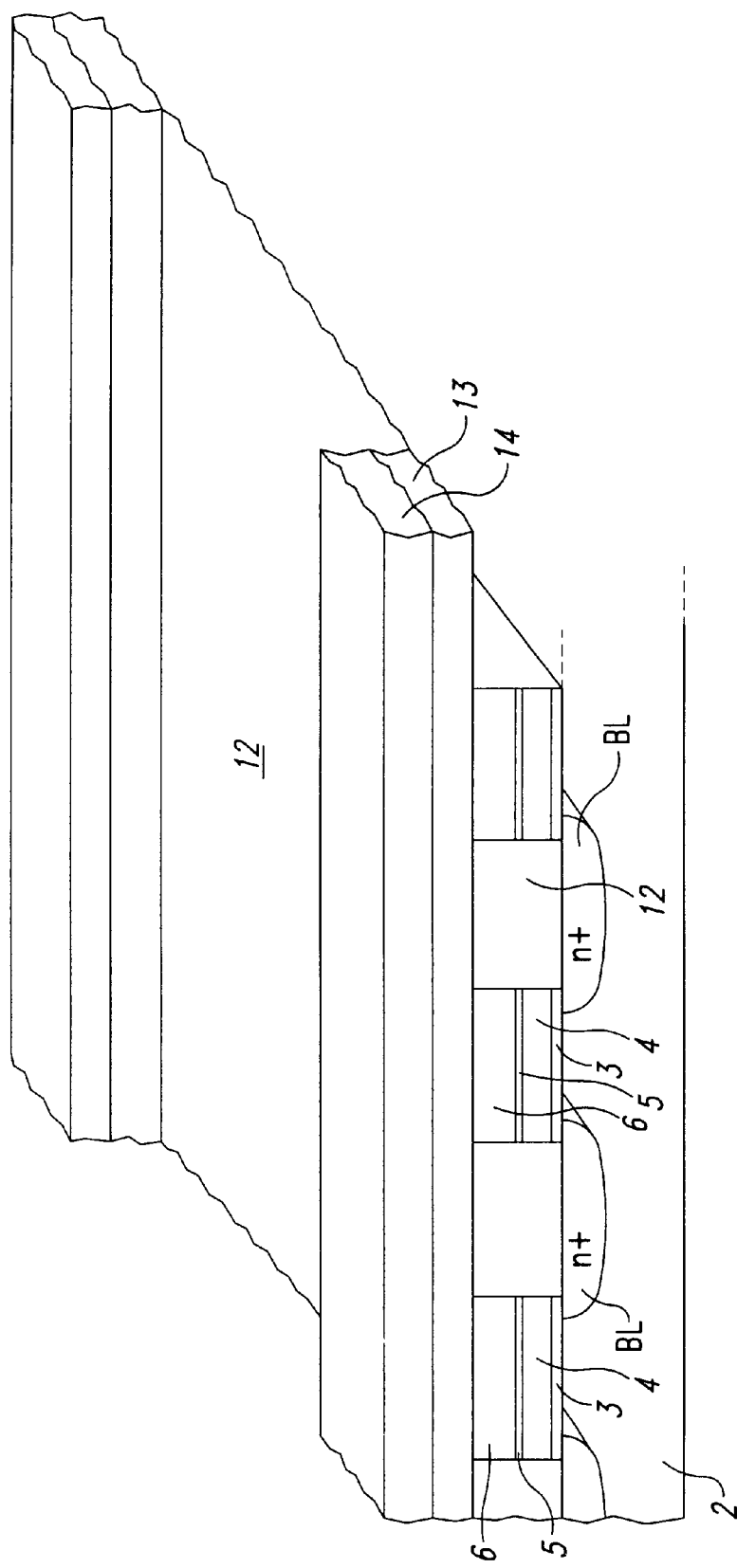
FIG. 5 is a perspective view showing a portion of a semiconductor involved in a step of the process.
Figure 6:
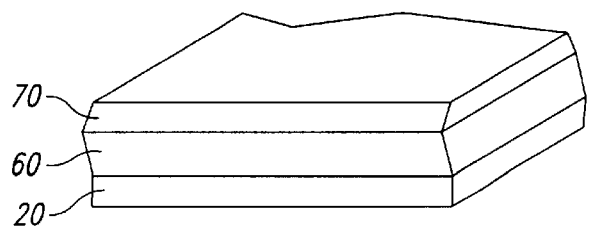
FIGS. 6 to 9 are perspective views showing a portion of a semiconductor in the evolution of a manufacturing process according to another embodiment of the invention.

At this point, as shown in FIG. 5, at least one dielectric layer 12 is conventionally deposited to planarize the semiconductor substrate surface by filling gaps between gate regions 10. The dielectric layer 12 is subjected to unmasked etching for exposing the surface of the poly cap layer 6 and removing the islands 11. In this way, the dielectric layer 12 is confined to just the interstitial regions between gate regions 10.

At this point, a multiple deposition can be carried out which comprises a conductor layer 13 and an optional final conductor layer 14, followed by an etching step using conventional photolithography to define parallel strips having different widths and being oriented in an orthogonal direction to that of the bit lines, such as the matrix word lines.

These strips are best seen in FIG. 5, which is a perspective view of the structure formed by the process steps carried out thus far.

To summarize, the process of this embodiment of the invention allows the gate regions 10 of the matrix cells to be defined using an oxide island 11 as a mask for the protection of the underlying layers. In this way, the definition of the gate regions 10 of the memory cell matrix 1 is greatly improved over a manufacturing process which employs a single photolithographic definition step.

Furthermore, in comparison to the prior art, the self-aligned etching step for defining the matrix gate regions is avoided, this step becoming a fairly critical one with decreasing geometric dimensions of the cell.

The previous description is given with reference to the technical field of virtual ground memories, but the process can also be used to provide semiconductor portions whose shape includes sharp corner edges.

According to another embodiment of the invention shown in FIGS. 6–9, on a semiconductor substrate 20 is deposited a stack structure comprising a first layer 60, such as polysilicon, and a protective layer 70 of a different material from the first layer, such as a dielectric layer. The first layer 60 may be any suitable layer in nature and material, and may be either a dielectric, nitride, or conductor layer for example. Advantageously, the stack structure may include additional layers, such as other conductive or insulative layers.

Figure 7:
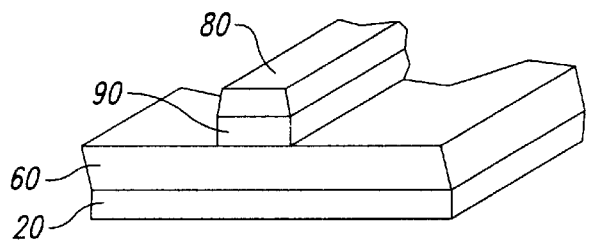

At this step of the manufacturing process according to this embodiment of the invention, regions of the stack structure are defined. A first mask 80 of a photo-sensitive material, e.g. of resist, is used to define the protective layer 70 along a first direction. The protective layer 70 is etched away using a conventional photolithographic step. (FIG. 7)

After removing the first mask 80 of resist, the remaining protective layer 70 appears as a plurality of parallel protective strips 90 extending in the first direction and overlying the first layer 60.

A second mask 101 of photo-sensitive material, such as a photoresist, is used to define the protective strips 90 along a second direction, substantially orthogonal to the first direction.

Figure 8:
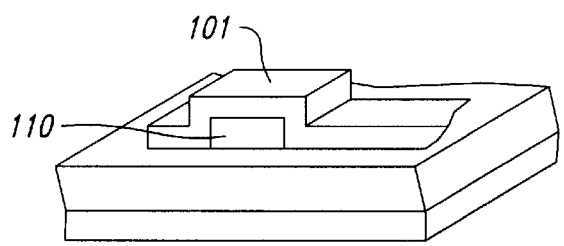

FIG. 8 shows the protective strips 90 after they have been subjected to further etching by a conventional photolithographic step. At this point, the original protective layer 70 appears as formed by a plurality of islands 110 overlying the first layer 60. The second mask 101 is then removed.

Figure 9:
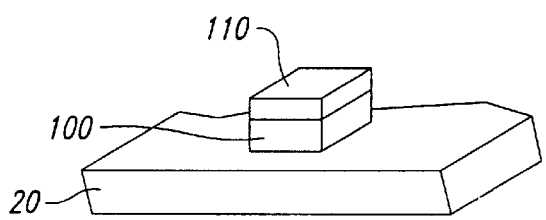

The portion of the stack structure that is unprotected by the plurality of protective islands 110 is etched away using a conventional photolithographic step to remove the first layer 60 and expose the substrate 20. Shown in FIG. 9 is the newly etched island 100 that was made from the first layer 60 and is covered by the protective island 110 that was made from the original protective layer 70. Of course, if any additional layers are provided on the semiconductor substrate 20 in the stacked structure, they too will be etched to form the desired regions.

Thus, the regions are now formed with sharp corner edges. This embodiment of the invention allows regions with sharp corner edges lying in plural predetermined directions to be provided using plural masking levels.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing portions of device regions formed on a semiconductor substrate comprising:

forming a stack structure on the semiconductor substrate including at least a first layer to be defined and a second protective layer;

defining the device regions by photolithography using a first photoresist mask having "definition along a first direction", to thereby define in said second protective layer a plurality of parallel strips which delimit a first dimension of the device regions to be formed, the first photoresist mask defining opposite first sides of each of the parallel strips;

etching away first portions of said second protective layer to define said plurality of parallel strips;

photolithographing using a second photoresist mask having "definition along a second direction" to define a plurality of islands in said plurality of parallel strips, the second photoresist mask defining opposite second sides of each of the islands, the second sides being orthogonal to the first sides;

etching away second portions of said second protective layer to define said plurality of islands; and etching away said first layer to define the device regions, using said plurality of islands as a mask.

2. A method to make an integrated circuit comprising:

forming a first layer on a semiconductor substrate;

forming a second layer disposed on the first layer;

forming an insulating layer disposed over the second layer;

masking a first portion of the insulating layer with a first mask, the first portion of the insulating layer delimiting a plurality of parallel strips extending in a first direction;

etching the first portion of the insulating layer to form the plurality of parallel strips;

masking a first portion of at least one of the parallel strips with a second mask, the first portion of the at least one of the parallel strips delimiting a plurality of islands;

etching the at least one of the parallel strips to form the plurality of islands; and using the plurality of islands as a mask while etching the second layer and the first layer to expose a portion of the semiconductor substrate.

3. The method of claim 2 wherein the first layer is a gate oxide layer and wherein the second layer is a first polysilicon layer, the method further comprising:

forming an interpolysilicon layer disposed on the first polysilicon layer; and forming a second polysilicon layer disposed on the interpolysilicon layer.

4. The method of claim 2 further comprising implanting a dopant into the semiconductor substrate using the first mask as an implantation mask.

5. The method of claim 2 wherein the plurality of islands are delimited in the first direction and a second direction, and wherein the first direction is substantially orthogonal to the second direction.

6. A method to make an integrated circuit, comprising:

forming a first layer on a semiconductor substrate;

forming a second layer disposed on the first layer, wherein the first layer is a gate oxide layer and wherein the second layer is a first polysilicon layer;

forming an insulating layer disposed over the first polysilicon layer;

masking a first portion of the insulating layer with a first mask, the first portion of the insulating layer delimiting a plurality of parallel strips extending in a first direction;

etching the first portion of the insulating layer to form the plurality of parallel strips;

masking a first portion of at least one of the parallel strips with a second mask, the first portion of the at least one of the parallel strips delimiting a plurality of islands;

etching the at least one of the parallel strips to form the plurality of islands;

forming an interpolysilicon layer disposed on the first polysilicon layer;

forming a second polysilicon layer disposed on the interpolysilicon layer; and using the plurality of islands as a mask while etching the second polysilicon layer, the interpolysilicon layer, the first polysilicon layer, and the gate oxide layer to expose a portion of the semiconductor substrate.

7. The method of claim 6 wherein the etched gate oxide layer, the first polysilicon layer, the interpolysilicon layer and the second polysilicon layer form a floating gate for a memory cell.

8. The method of claim 7 further comprising forming a layer of protective oxide over the floating gate.

9. The method of claim 7 further comprising forming spacers adjacent to the floating gate.

10. The method of claim 7 further comprising:

forming a second floating gate for a second floating cell;

depositing a planarizing dielectric material between the floating gate and the second floating gate;

etching the planarizing dielectric to expose the second polysilicon layer of the floating gate and the second floating gate; and depositing a conduction layer over the exposed second polysilicon layer.

11. The method of claim 10 further comprising forming the conduction layer into word lines for a memory circuit.

12. A process for manufacturing electronic semiconductor integrated memory devices having a virtual ground and comprising at least one matrix of floating gate memory cells, the matrix being formed on a semiconductor substrate with a plurality of continuous bit lines extending across the substrate as discrete parallel strips, the process comprising:

forming an oxide layer over the semiconductor substrate;

forming a stack structure on the semiconductor substrate, the stack structure including a first conductor layer, a first dielectric layer, and a second conductor layer;

depositing a second dielectric layer over the stack structure;

defining, using a polysilicon mask of a first direction, the second dielectric layer into a plurality of parallel dielectric strips which delimit a first dimension of floating gate regions of the floating gate memory cells;

etching away a first portion of the second dielectric layer to define the plurality of parallel dielectric strips;

defining, using a polysilicon mask of a second direction, at least one of the parallel dielectric strips into a plurality of dielectric islands;

etching away a second portion of the second dielectric layer to define the plurality of dielectric islands; and etching away portions of the stack structure and the oxide layer to define the floating gate regions of the floating gate memory cells using the plurality of dielectric islands as an etching mask.

13. The process according to claim 12, wherein the second direction is substantially orthogonal to the first direction.

14. The process according to claim 13, wherein the first direction is the same as a direction of the continuous bit lines.

15. The process according to claim 14, further comprising:

forming spacers on sidewalls of the floating gate regions;

implanting the semiconductor substrate with a dopant to confer a predetermined conductivity in the continuous bit lines;

filling a gap between two floating gate regions with a dielectric; and planarizing the dielectric in the gap between the floating gate regions.

16. The process according to claim 15, wherein the polysilicon mask of the first direction is used for implanting the semiconductor substrate with the dopant.

* * * * *